United States Patent
Loy et al.

(10) Patent No.: US 11,050,426 B1
(45) Date of Patent: Jun. 29, 2021

(54) LOGIC GATE DEVICES AND METHODS OF FORMING A LOGIC GATE DEVICE

(71) Applicant: GLOBALFOUNDRIES Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/816,361

(22) Filed: Mar. 12, 2020

(51) Int. Cl.
| | |
|---|---|
| *H03K 19/173* | (2006.01) |
| *H03K 19/20* | (2006.01) |
| *H03K 19/0944* | (2006.01) |
| *G11C 13/00* | (2006.01) |

(52) U.S. Cl.
CPC ......... *H03K 19/20* (2013.01); *H03K 19/0944* (2013.01); *G11C 13/0002* (2013.01)

(58) Field of Classification Search
CPC . G11C 13/0002; H03K 19/0944; H03K 19/20
See application file for complete search history.

(56) References Cited

U.S. PATENT DOCUMENTS

| | | | | |
|---|---|---|---|---|
| 3,196,284 | A * | 7/1965 | Hunter | H03K 19/09 326/101 |
| 8,294,489 | B2 * | 10/2012 | Tanamoto | H03K 19/1778 326/41 |
| 2018/0159536 | A1 * | 6/2018 | Swartzlander | G11C 13/0069 |

OTHER PUBLICATIONS

Memristor based unbalanced ternary logic gates, Muhammad Khalid, Analog Integr Circ Sig Process (2016) 87:399-406, Apr. 12, 2016.*
Shen et al., "Memristor Logic Operation Gate With Share Contact RRAM Cell", IEEE Electron Device Letters, Dec. 2011, pp. 1650-1652, vol. 32, No. 12, IEEE.
Kvatinsky et al., "MAGIC—Memristor-Aided Logic", IEEE Transactions on Circuits and Systems—II: Express Briefs, Nov. 2014, pp. 895-899, vol. 61, No. 11, IEEE.
Zhou et al., "16 Boolean logics in three steps with two anti-serially connected memristors", Applied Physics Letters, Jun. 2015, 6 pages, vol. 106.
Moreau et al., "Reliable ReRAM-based Logic Operations for Computing in Memory", IFIP/IEEE International Conference on Very Large Scale Integration (VLSI-SoC), 2018, pp. 192-195, IEEE.
Kingra et al., "SLIM: Simultaneous Logic-in-Memory Computing Exploiting Bilayer Analog OxRAM Devices", Scientific Reports, 2020, 13 pages.

* cited by examiner

*Primary Examiner* — Kurtis R Bahr
(74) *Attorney, Agent, or Firm* — Viering Jentschura & Partner MBB

(57) ABSTRACT

According to various embodiments, a logic gate device includes a transistor, a first resistor, a second resistor and a third resistor. The first resistor is connected between a first input terminal of the logic gate device and a gate terminal of the transistor. The second resistor is connected between a second input terminal of the logic gate device and the gate terminal. The third resistor is connected between a voltage supply terminal and a first terminal of the transistor. The logic gate device is configured to generate an output voltage at the first terminal based on input voltages received at the first input terminal and the second input terminal.

17 Claims, 9 Drawing Sheets

| | A | B | Z |
|---|---|---|---|
| 310 | 0 | 0 | 1 |
| 312 | 0 | 1 | 0 |
| 314 | 1 | 0 | 0 |
| 316 | 1 | 1 | 0 |

LOGIC GATE DEVICES AND METHODS OF FORMING A LOGIC GATE DEVICE

TECHNICAL FIELD

Various embodiments relate to logic gate devices and methods of forming a logic gate device.

BACKGROUND

The logic gate is a device that implements a Boolean function. The logic gate is a basic building block of electronic circuits and combinations of logic gates may be used to implement algorithms. Electronic devices including logic units, multiplexers, microprocessors may include large quantities of logic gates, up to the more than millions or billions of logic gates. Reconfigurable logic gates may also be useful in reducing the quantity of logic gates required within an electronic device, as a single logic gate may perform different types of logical operations. However, existing reconfigurable logic gate devices have large circuit structures and require large voltages for operation. In addition, these reconfigurable logic gate devices typically require an external initialization circuit to initialize the logic function of the logic gate device, thereby further enlarging the require footprint area.

SUMMARY

According to various embodiments, there may be provided a logic gate device. The logic gate device may include a transistor, a first resistor, a second resistor and a third resistor. The first resistor may be connected between a first input terminal of the logic gate device and a gate terminal of the transistor. The second resistor may be connected between a second input terminal of the logic gate device and the gate terminal. The third resistor may be connected between a voltage supply terminal and a first terminal of the transistor. The logic gate device may be configured to generate an output voltage at the first terminal based on input voltages received at the first input terminal and the second input terminal.

According to various embodiments, there may be provided a logic gate device. The logic gate device may include a first input terminal, a second input terminal and an output terminal for indicating the logic state of the logic gate device. The logic gate device may also include a transistor having a first terminal, a second terminal, and a gate terminal. The logic gate device may include a first resistor connected between the first input terminal of the logic gate device and the gate terminal of the transistor, a second resistor connected between the second input terminal of the logic gate device and the gate terminal of the transistor, and a third resistor connected between a voltage supply terminal and the first terminal of the transistor. The first terminal of the transistor may be connected to the output terminal of the logic gate device.

According to various embodiments, there may be provided a method of forming a logic gate device. The method may include providing a transistor having a first terminal, a second terminal, and a gate terminal. The method may include connecting a first resistor between a first input terminal of the logic gate device and the gate terminal of the transistor, and connecting a second resistor between a second input terminal of the logic gate device and the gate terminal of the transistor. The method may include connecting a third resistor between a voltage supply terminal and the first terminal of the transistor. The logic gate device may be configured to generate an output voltage at the first terminal of the transistor based on input voltages received at the first input terminal and the second input terminal of the logic gate device.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

In order that the invention may be readily understood and put into practical effect, various embodiments will now be described by way of examples and not limitations, and with reference to the figures.

Figure 1:
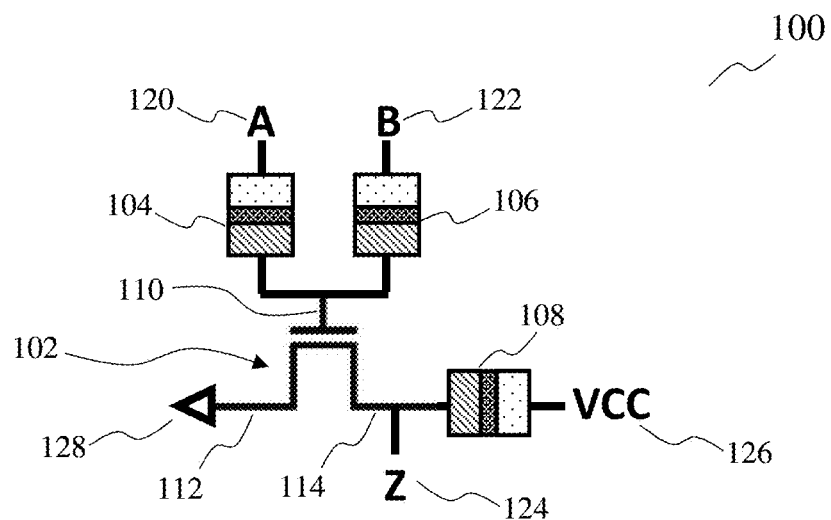
FIG. 1 shows a logic gate device according to various embodiments.

FIG. 1 shows a logic gate device 100 according to various embodiments. The logic gate device 100 may include a transistor 102 connected to a first resistor 104, a second resistor 106 and a third resistor 108. As such, the basic structure of the logic gate device 100 may be referred herein as the one-transistor-three-resistors (1T1R+2R) circuit configuration. Although the logic gate device 100 includes one transistor and three resistors, the first resistor 104 and the second resistor 106 may be arranged above the third resistor 108 such that the 1T2R+1R circuit only occupies the space of one-transistor-one-resistor (1T1R).

The logic gate device 100 may be configured to receive two input voltages and further configured to generate an output voltage based on the two input voltages and in accordance with a logic function. The logic function may be configurable between NOR or NAND.

The logic gate device 100 may include a first input terminal 120 and a second input terminal 122 for receiving the respective input voltages. The logic gate device 100 may include an output terminal 124 for outputting the output voltage. The logic gate device 100 may also include a voltage supply terminal 126 and a further voltage supply terminal 128. The voltage supply terminal 126 may be a bitline of the logic gate device 100.

The transistor 102 may have a first terminal 114, a second terminal 112 and a gate terminal 110. The transistor 102 may be a field-effect transistor (FET) having a gate terminal, a drain terminal and a source terminal. The transistor 102 may be a metal-oxide-semiconductor field-effect transistor (MOSFET). The transistor 102 may be an n-channel transistor. If the transistor 102 is an n-channel transistor, the first terminal 114 may be the drain terminal while the second terminal 112 may be the source terminal. Alternatively, the transistor 102 may be a p-channel transistor. If the transistor 102 is a p-channel transistor, the first terminal 114 may be the source terminal while the second terminal 112 may be the drain terminal. The output terminal 124 of the logic gate device 100 may be the first terminal 114 of the transistor 102.

The transistor 102 may receive a supply voltage through the voltage supply terminal 126 and may receive another supply voltage at the further voltage supply terminal 128. For example, the voltage supply terminal 126 may be connected to a positive voltage, and the further voltage supply terminal 128 may be connected to zero voltage.

The first resistor 104 may be connected between the first input terminal 120 and the gate terminal 110. The second resistor 106 may be connected between the second input terminal 122 and the gate terminal 110. The first resistor 104 and the second resistor 106 may have the same resistance values. The third resistor 108 may be connected between the first terminal 114 and a voltage supply terminal 126. The third resistor 108 may be selectively tunable such that its resistance may be a first value or a second value. The second value may be larger than the first value. For example, the first value may be a resistance ranging from 1 MΩ to 2 MΩ. For example, the second value may be a resistance ranging from 1 GΩ to 1.5 GΩ. The logic function of the logic gate device 100 may depend on the resistance of the third resistor 108. As such, the logic gate device 100 may be reconfigurable to perform different logic functions. The logic gate device 100 may be reconfigured by tuning the resistance of the third resistor 108 during an initialization process of the logic gate device 100.

According to various embodiments, the first resistor 104 and the second resistor 106 may have large resistance values, for example, 1 GΩ or larger. The large resistance values of these resistors may keep the electrical current flowing to the gate terminal 110 low, such that power consumption of the logic gate device 100 is low Like the third resistor 108, the respective resistances of the first resistor 104 and the second resistor 106 may also be selectively tunable between a first value and a second value that may be larger than the first value. In subsequent paragraphs, the first value may also be referred herein as a lower resistance or lower value. The second value may be also be referred herein as a higher resistance or lower value. The first resistor 104 and the second resistor 106 may be tuned to operate in the higher resistance mode to minimize the power consumption of the logic gate device 100.

According to various embodiments, one or more of the first resistor 104, the second resistor 106 and the third resistor 108 may be a resistive random-access memory (ReRAM) or a memristor. The resistance of a ReRAM may be selectively varied, i.e. tuned. A ReRAM may be tuned to operate in one of its pristine state, "SET" state and "RESET" state. In the pristine state, the ReRAM may have a very high resistance, such as at least 1 GΩ. In the "SET" state, also known as a low resistance state (LRS), the ReRAM may have a low resistance, for example around 1 KΩ. In the "RESET" state, also known as a high resistance state (HRS), the ReRAM may have a high resistance, for example, around 1 to 2 MΩ. Tuning the resistance of the third resistor 108 between the first value and the second value for changing the logic function of the logic gate device 100 may involve selectively tuning the third resistor 108 to operate in the "RESET" state and the pristine state. In other words, the third resistor 108 may have a resistance corresponding to the first value when it is operating in the "RESET state" or HRS; and the third resistor 108 may have a resistance corresponding to the second value when it is operating in the pristine state. According to various embodiments, the first resistor 104, the second resistor 106 and the third resistor 108 may be identical.

Figure 2:
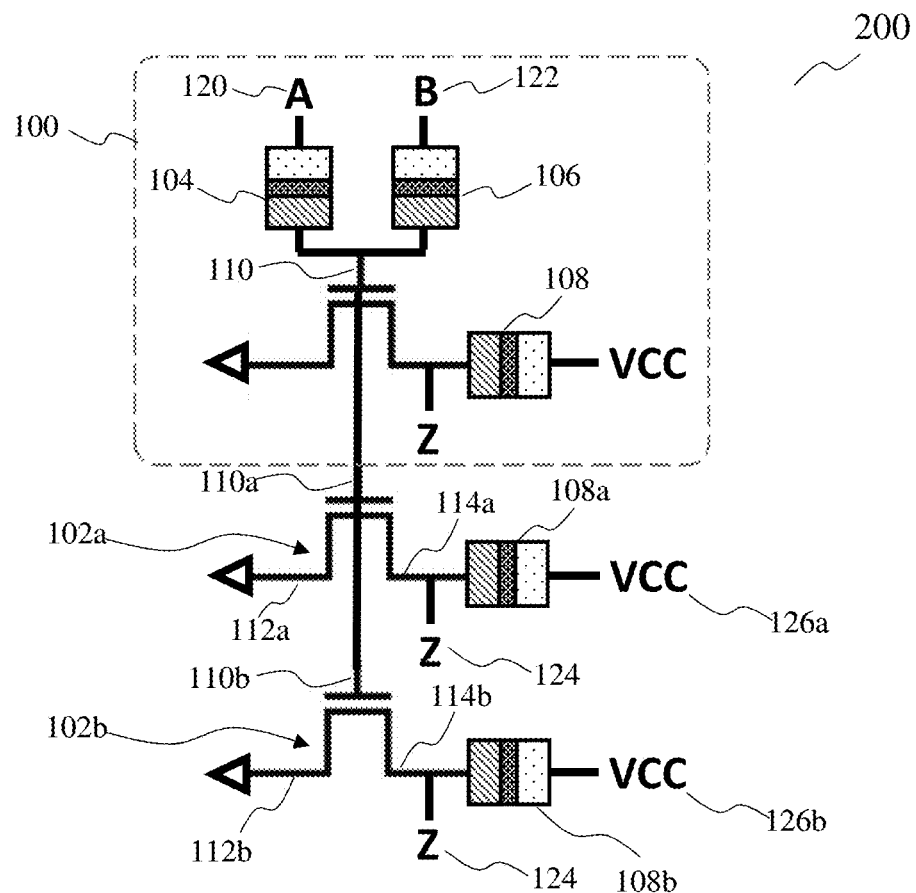
FIG. 2 shows a logic gate device according to various embodiments.

FIG. 2 shows a logic gate device 200 according to various embodiments. The logic gate device 200 may include the logic gate device 100, cascaded with at least one other transistor 102. In the logic gate device 200, a plurality of logic gate functions may be connected in an array. The logic gate device 200 is an example of how a plurality of logic gate functions may be compactly implemented. A common electrical connection, for example, a wordline, may connect the plurality of gate terminals 110 of the plurality of transistors 102. The first terminal of each transistor 102 may generate a respective output of a respective logic gate. The logic gate device 200 may only include a single first resistor 104 and a single second resistor 106. The at least one other transistor 102 may be referred herein as transistors 102a, 102b. The transistor 102a may have a first terminal 114a, a second terminal 112a, and a gate terminal 110a. A third resistor 108a may be connected between the first terminal 114a and a voltage supply terminal 126a. The transistor 102b may have a first terminal 114b, a second terminal 112b, and a gate terminal 110b. A third resistor 108b may be connected between the first terminal 114b and a voltage supply terminal 126b. The plurality of third resistors 108 may be tuned to respective resistance values to achieve the desired respective logic functions. In the example shown in FIG. 2, the logic gate device 200 may generate three logic outputs even though its structure only occupies the space of three-transistors-three-resistors.

An example of the operation of a logic gate device 100a according to various embodiments, will be described with respect to FIGS. 3A to 3D. For ease of reference, the logic gate device 100 is referred herein as 100a when the third resistor 108 is tuned to have a resistance of the second value (higher resistance), and referred to as 100b when the third resistor is tuned to have a resistance of the first value (lower resistance), even though the logic gate device 100a and the logic gate device 100b are structurally identical. The transistor 102 may be an n-channel MOSFET, the first terminal 114 may be the drain of the transistor 102 and the second terminal 112 may be the source of the transistor 102. The voltage values shown in the figures are simulation results obtained using HSPICE simulation. The simulation may be performed based on assumptions that the first resistor 104, the second resistor 106 and the third resistor 108 are ReRAMs and that the transistor 102 is a high voltage threshold (HVT), 0.14 um MOSFET. In the simulation, the second value is 1GΩ. In the example, the threshold voltage for switching on the transistor 102 may be in a range of 0.5V to 1V, for example, 1V.

Each of the first resistor 104 and the second resistor 106 also have a resistance value of 1 GΩ. In the example, a logic value "0" input to the logic gate device is 0V while a logic value "1" input to the logic gate device is 1V. The transistor 102 may function as a switch that is turned "ON" or "OFF" depending on the voltage received at the gate terminal 110. When the potential difference between the gate terminal 110 and the source is zero, i.e. $V_{GS}=0V$, the transistor 102 may operate in the "OFF" state that does not allow current to flow through between the first terminal 126 and the second terminal 128. When the voltage at the gate terminal 110 is a voltage above a threshold voltage, i.e. $V_{GS} \geq V_{TH}$, the transistor 102 may operate in the "ON" state that allows current to flow through between the first terminal 126 and the second terminal 128. The current that flows through the first terminal 126 may be referred to as the drain current, ID. The magnitude of the drain current may depend on $V_{GS}$. In this example, the voltage supplied to the voltage supply terminal 126 is 1V, while the voltage supplied to the further voltage supply terminal 128 is zero. In this example, since the further voltage supply terminal 128 is connected to electrical ground, $V_{GS}$ is equal to the voltage supplied to the gate terminal 110.

Figure 3A:
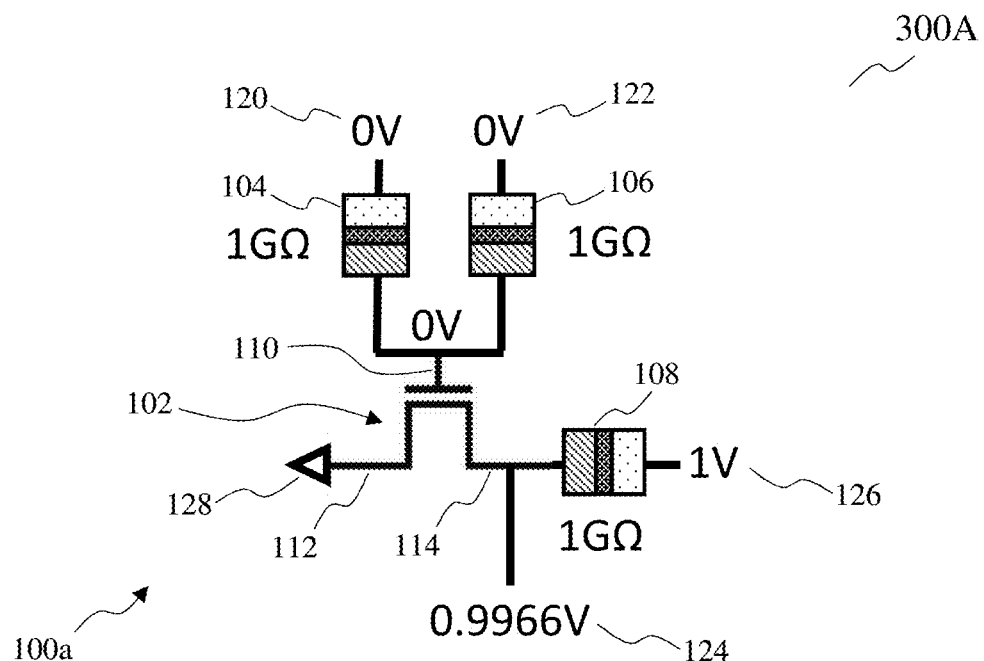
FIGS. 3A to 3D illustrate the operation of a logic gate device according to various embodiments.

FIG. 3A shows the operation of the logic gate device 100a when both input values to the logic gate device 100a are "0". In other words, the input voltages to both the first input terminal 120 and the second input terminal 122 of the logic gate device 100a are zero voltages. Since the input voltages are equal, no current flows through between the first input terminal and the second input terminal. The resulting voltage at the gate terminal 110 is, therefore, 0V, same as each of the input voltages. As such, the transistor 102 operates in the OFF state where the drain current is negligible. Consequently, the output voltage at the output terminal 124 is close to 1V, for example, around 0.9966V.

Figure 3B:
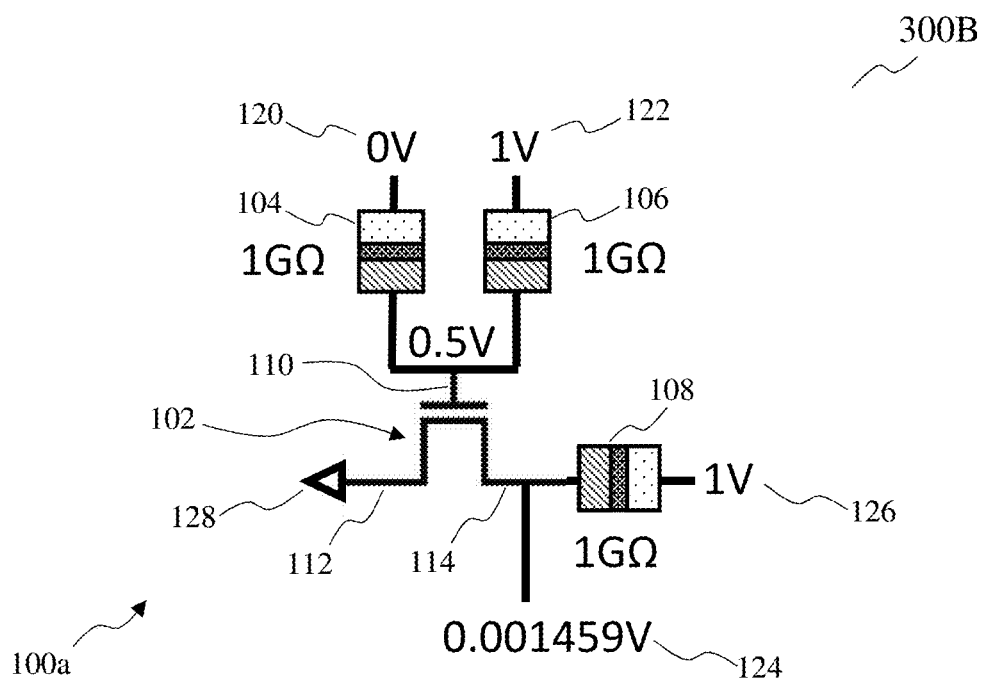

FIG. 3B shows the operation of the logic gate device 100a when the input voltage to the first input terminal 120 is 0V representing an input of "0" and the input voltage to the second input terminal 122 is 1V representing an input of "1". A current flows from the second input terminal 122 to the first input terminal 120. The resulting voltage at the gate terminal 110 is 0.5V, i.e. an average of the input voltages since the first resistor 104 and the second resistor 106 have equal resistance values. 0.5V may be above the threshold for switching on the transistor 102. As such, the transistor 102 operates in the ON state where current flows from the first terminal 126 to the second terminal 128. Since the resistance of the third resistor 108 is tuned to the higher resistance, there is a very large potential difference across the third resistor 108 when the current flows through. Consequently, the output voltage at the output terminal 124 is close to 0V, for example, around 0.001459V.

Figure 3C:
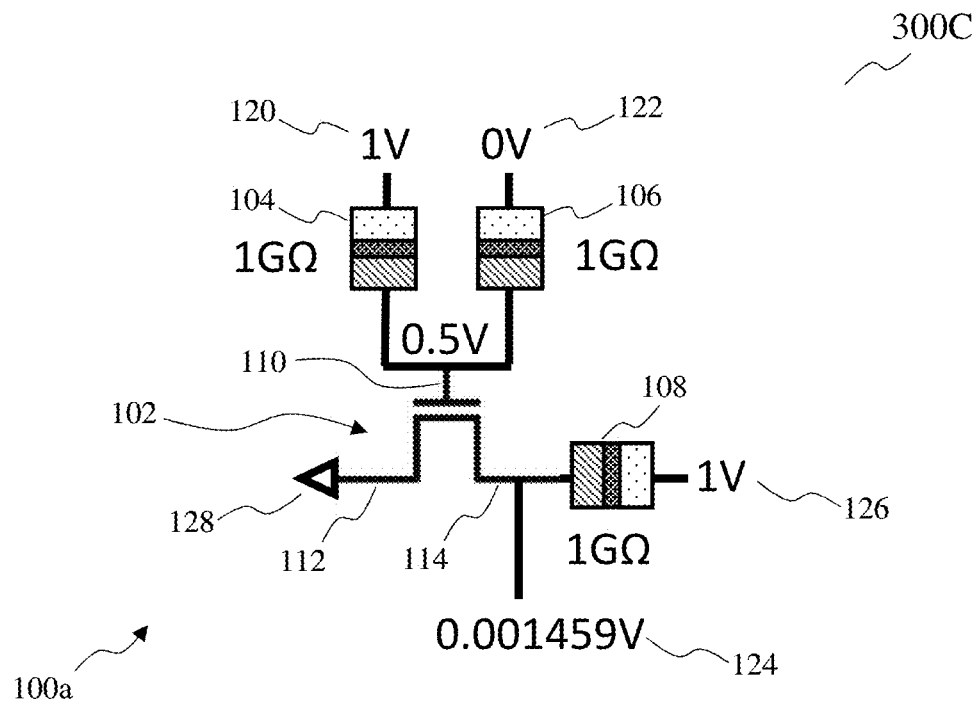

FIG. 3C shows the operation of the logic gate device 100a when the input voltage to the first input terminal 120 is 1V representing an input of "1" and the input voltage to the second input terminal 122 is 0V representing an input of "0". Similar to the operation shown in FIG. 3B, the resulting voltage at the gate terminal 110 is 0.5V and causes the transistor 102 to operate in the ON state. Current flows through the transistor 102, from the first terminal 126 to the second terminal 128 through the gate terminal 110, resulting in a large drop in voltage across the third resistor 108. The resulting output voltage at the output terminal 124 is close to 0V, for example, around 0.001459V.

Figure 3D:
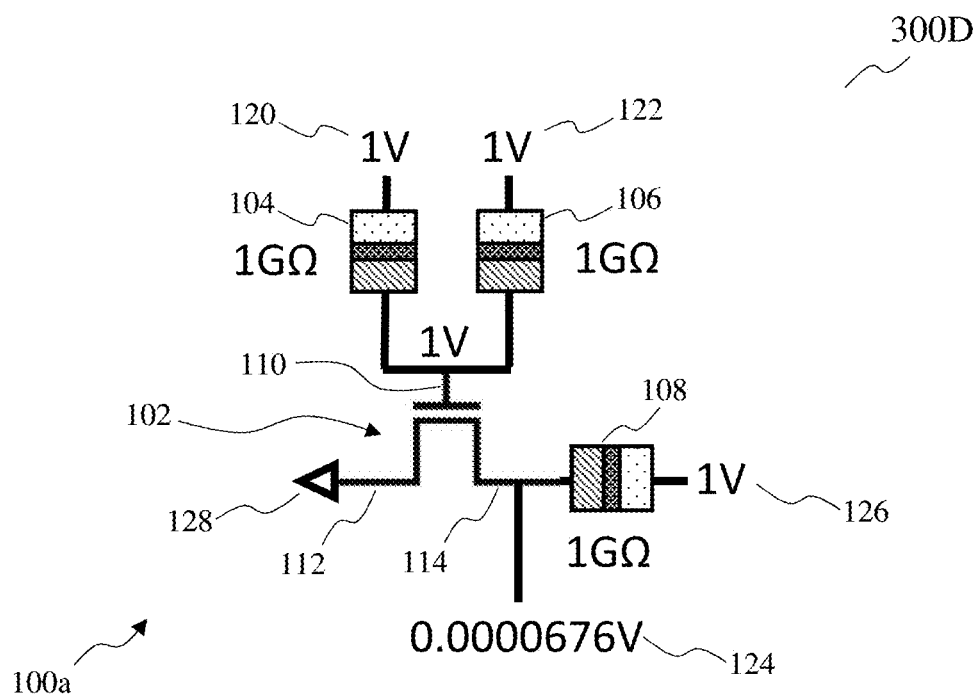

FIG. 3D shows the operation of the logic gate device 100a when both input values to the logic gate device 100a are "1". In other words, the input voltages to both the first input terminal 120 and the second input terminal 122 of the logic gate device 100a are 1V. Since the input voltages are equal, no current flows through between the first input terminal and the second input terminal. The resulting voltage at the gate terminal 110 is, therefore, 1V, same as both the input voltages. 1V may be above the threshold voltage, and as such, the transistor 102 operates in the ON state. Current flows from the first terminal 126 to the second terminal 128 across the third resistor 108. Due to the high resistance of the third resistor 108 which is tuned to the higher resistance, the output voltage at the output terminal 124 is nearly zero, for example, around 0.0000676V.

Figures 3E, 3F:
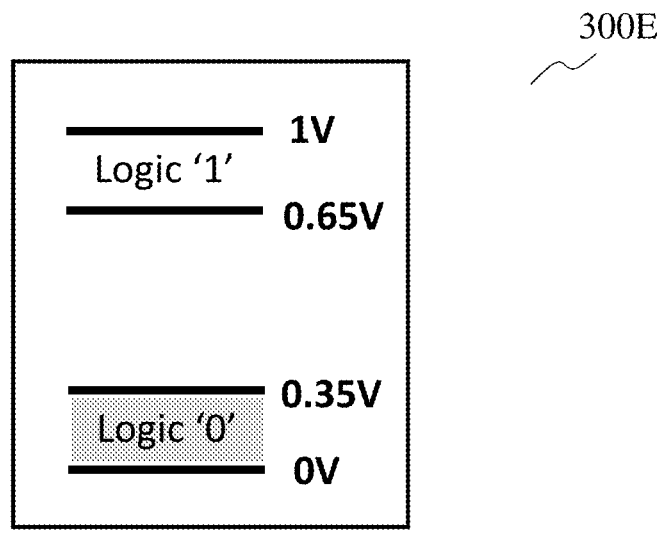
FIG. 3E shows a chart that maps the input and output voltages of the logic device of FIGS. 3A-3D to logic values.
FIG. 3F shows a table listing the input and output logic values of the logic device of FIGS. 3A-3D based on the mapping shown in the chart of FIG. 3E.

FIG. 3E shows a chart 300E that maps the input and output voltages of the logic device 100a to logic values. The mapping may be determined based on the simulation results described with respect to FIGS. 3A to 3D, for achieving the desired logic value outcomes for the logic gate device 100a. For example, a voltage range from 0.65V to 1V may represent the logic value of "1". A voltage range from 0V to 0.35V may represent the logic value of "0".

FIG. 3F shows a table 300F listing the input and output logic values of the logic device 100a according to the simulation of FIGS. 3A-3D, based on the mapping shown in the chart 300E. The table 300F includes a first column 302 labelled as "A", a second column 304 labelled as "B", and a third column 306 labelled as "Z. "A" represents a first input logic value, i.e. the input provided at the first input terminal 120. "B" represents a second input logic value, i.e. the input provided at the second input terminal 122. "Z" represents the output logic value, i.e. the output generated at the output terminal 124. The logic values in row 310 correspond to the voltages shown in FIG. 3A. The logic values in row 312 correspond to the voltages shown in FIG. 3B. The logic values in row 314 correspond to the voltages shown in FIG. 3C. The logic values in row 316 correspond to the voltages shown in FIG. 3D. As shown in the table 300F, the output logic values in response to the input logic values correspond to the NOR function. The logic gate device 100a may be configured to generate an output at the output terminal 124, in accordance with the NOR function, based on the inputs received at the first input terminal 120 and the second input terminal 122, when the third resistor 108 is configured to the higher resistance.

An example of the operation of a logic gate device 100b according to various embodiments, will be described with respect to FIGS. 4A to 4D. The logic gate device 100 is referred herein as 100b when the third resistor 108 is tuned to operate in the lower resistance. The voltage values shown in the figures are simulation results obtained using HSPICE simulation. The simulation may be performed based on the same assumptions as the simulation described with respect to FIGS. 3A to 3D. The lower resistance value is 2 MΩ.

Figure 4A:
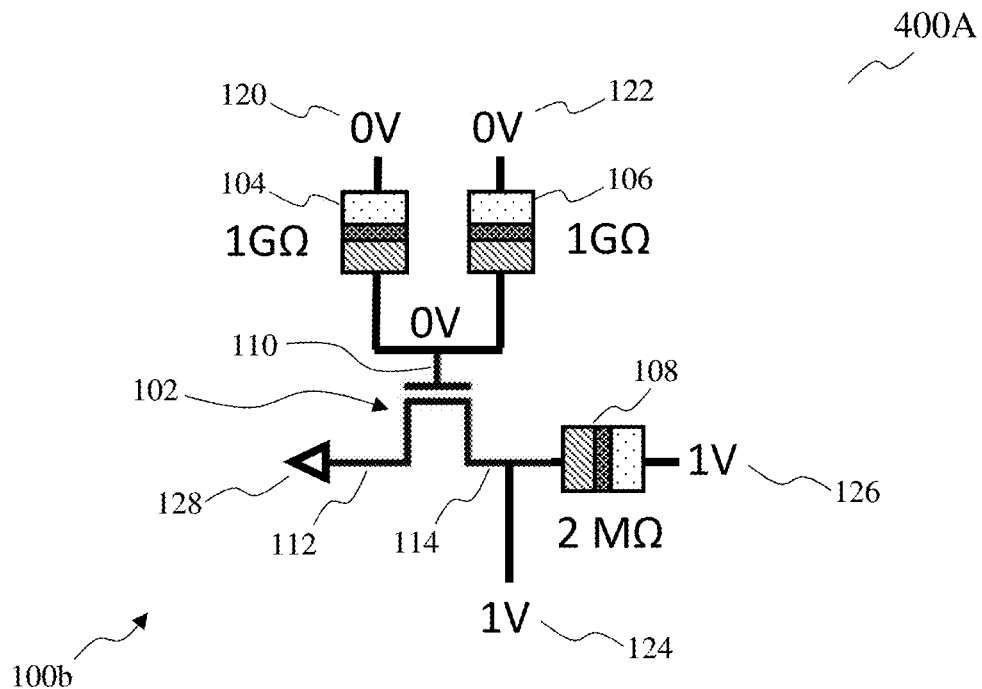
FIGS. 4A to 4D illustrate the operation of a logic gate device according to various embodiments.

FIG. 4A shows the operation of the logic gate device 100b when both input values to the logic gate device 100b are "0".

In other words, the input voltages to both the first input terminal 120 and the second input terminal 122 of the logic gate device 100b are zero voltages. Since the input voltages are equal, no current flows through between the first input terminal and the second input terminal. The resulting voltage at the gate terminal 110 is, therefore, 0V, same as both the input voltages. As such, the transistor 102 operates in the OFF state where the current flowing from the first terminal 126 to the second terminal 128 is negligible. Consequently, the output voltage at the output terminal 124 is close to 1V.

Figure 4B:
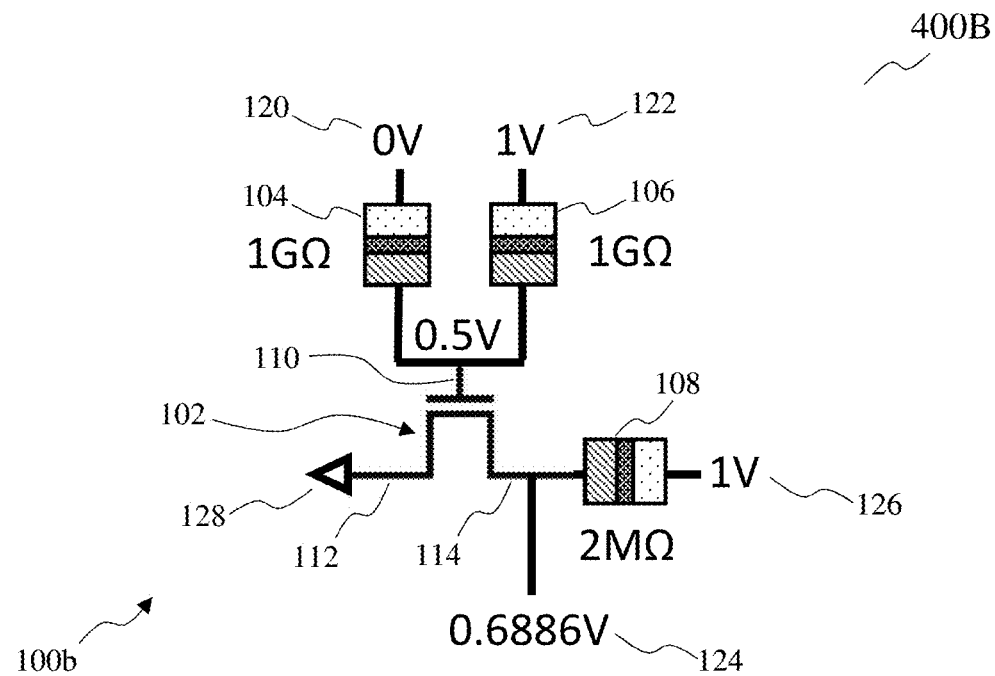

FIG. 4B shows the operation of the logic gate device 100b when the input voltage to the first input terminal 120 is 0V representing an input of "0" and the input voltage to the second input terminal 122 is 1V representing an input of "1". A current flows from the second input terminal 122 to the first input terminal 120. The resulting voltage at the gate terminal 110 is half of 1V, since the first resistor 104 and the second resistor 106 have equal resistance values. The resulting voltage of 0.5V at the gate terminal 110 may be insufficient to fully turn on the transistor 102. Since the third resistor 108 is tuned to the lower resistance, the potential difference across the third resistor 108 of the logic device 100b when the transistor 102 is ON, is lower than the potential difference across the third resistor 108 of the logic device 100a when the transistor 102 is ON. As such, the output voltage at the output terminal 124 is about 0.6886V, which is higher than the output voltage shown in FIG. 3B.

Figure 4C:
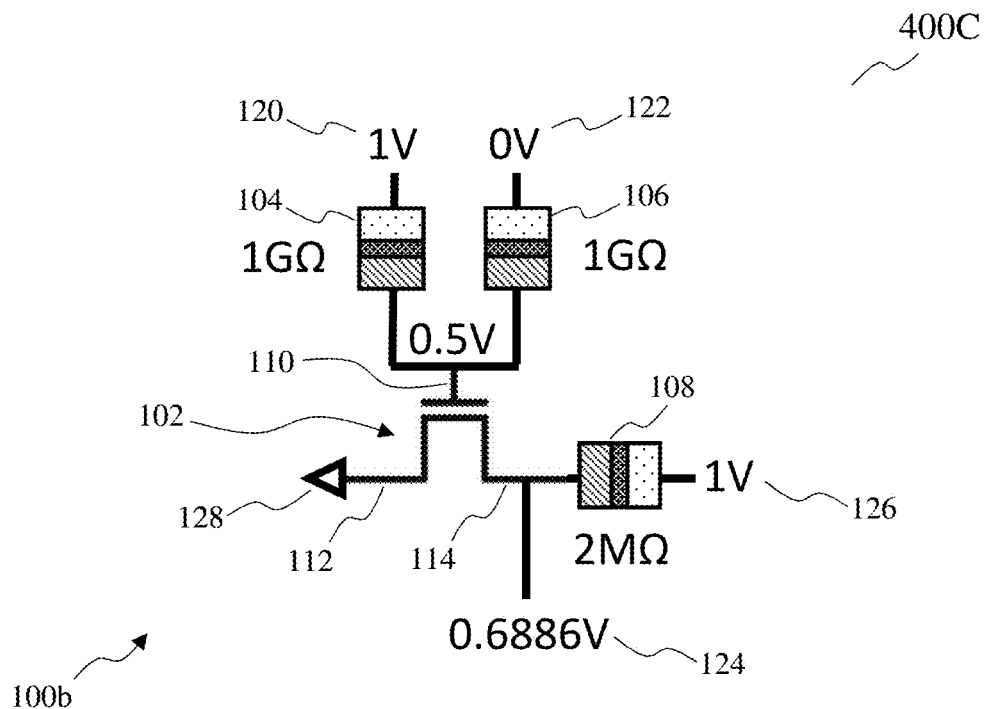

FIG. 4C shows the operation of the logic gate device 100b when the input voltage to the first input terminal 120 is 1V representing an input of "1" and the input voltage to the second input terminal 122 is 0V representing an input of "0". The resulting voltage at the gate terminal 110 is 0.5V, which may be insufficient to fully turn on the transistor 102. As a result, there may be a significant voltage drop across the transistor 102. The resulting output voltage at the output terminal 124 is similar to the output voltage shown in FIG. 4B, for example, around 0.6886V.

Figure 4D:
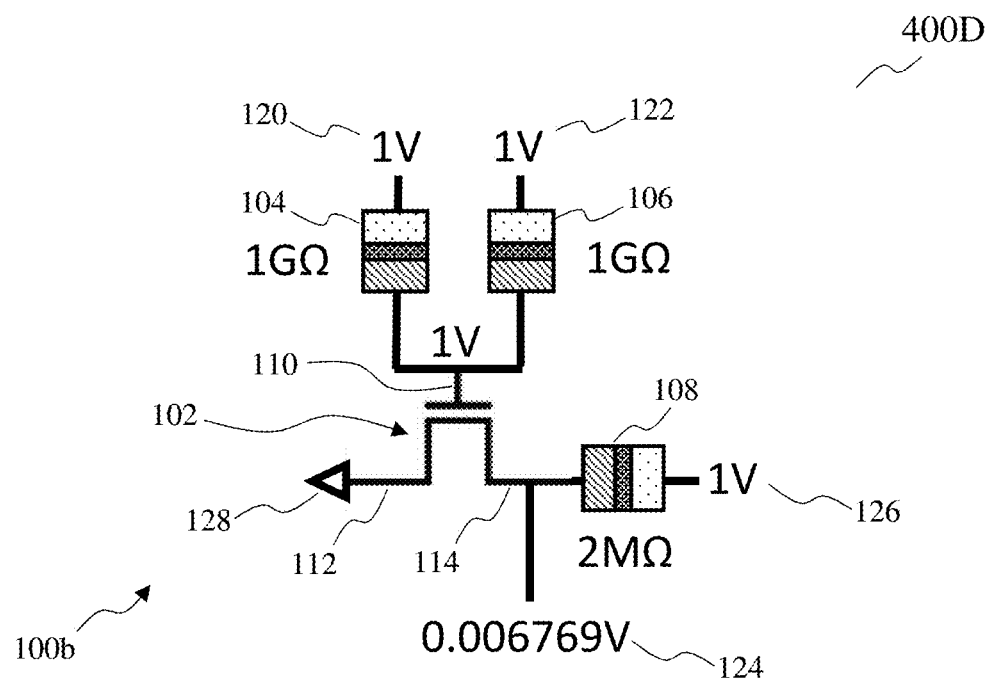

FIG. 4D shows the operation of the logic gate device 100b when both input values to the logic gate device 100b are "1". In other words, the input voltages to both the first input terminal 120 and the second input terminal 122 of the logic gate device 100b are 1V. Since the input voltages are equal, no current flows through between the first input terminal 120 and the second input terminal 122. The resulting voltage at the gate terminal 110 is, therefore, 1V, same as both the input voltages. 1V may be above the threshold voltage, and as such, the transistor 102 operates in the fully "ON" state. As such, a large current flows across the third resistor 108, causing a large drop in potential difference across the third resistor. As a result, the output voltage at the output terminal 124 is nearly zero, for example, around 0.006769V.

Figures 4E, 5:
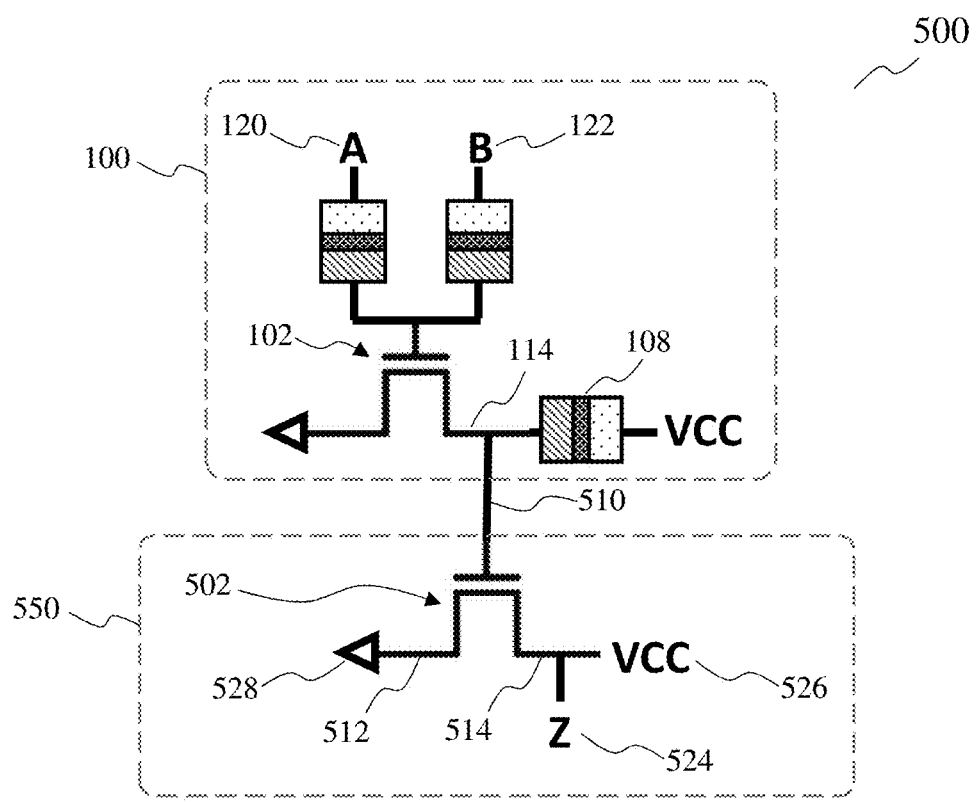
FIG. 4E shows a table listing the input and output logic values of the logic device of FIGS. 4A-4D based on the mapping shown in the chart of FIG. 3E.
FIG. 5 shows a logic gate device according to various embodiments.

FIG. 4E shows a table 400E listing the input and output logic values of the logic device 100b according to the simulation of FIGS. 4A-4D, based on the mapping shown in the chart 300E. The table 400E include a first column 402 labelled as "A", a second column 404 labelled as "B", and a third column 406 labelled as "Z. "A" represents a first input logic value, i.e. the input provided at the first input terminal 120. "B" represents a second input logic value, i.e. the input provided at the second input terminal 122. "Z" represents the output logic value, i.e. the output generated at the output terminal 124. The logic values in row 410 correspond to the voltages shown in FIG. 4A. The logic values in row 412 correspond to the voltages shown in FIG. 4B. The logic values in row 414 correspond to the voltages shown in FIG. 4C. The logic values in row 416 correspond to the voltages shown in FIG. 4D. As shown in table 400E, the output logic values in response to the input logic values correspond to the NAND function. The logic gate device 100b may be configured to generate an output at the output terminal 124, in accordance with the NAND function, based on the inputs received at the first input terminal 120 and the second input terminal 122, when the third resistor 108 is configured to the lower resistance FIG. 5 shows a logic gate device 500 according to various embodiments. The logic gate device 500 may include the logic gate device 100 and an inverter 550. The inverter 550 may include a transistor 502. The transistor 502 may be identical to the transistor 102. The transistor 502 may be an n-channel MOSFET. A gate terminal 510 of the transistor 502 may be connected to the first terminal 114, in other words, the output terminal of the logic gate device 100. A first terminal 514 of the transistor 502 may be connected to a voltage supply 526. The output terminal 524 of the logic gate device 500 may be the first terminal 514 of the transistor 502. In other words, the logic gate device 500 may be configured to generate an output voltage at the first terminal 514 of the transistor 502 based on inputs received at the first input terminal 120 and the second input terminal 122, in accordance with a second logic function. The second logic function may be an inversion of the logic function of the logic device 100. For example, when the logic gate device 100 is configured to be the logic gate device 100a with the third resistor 108 having the higher resistance value, the logic gate device 500 may generate an output according to logic OR. For example, when the logic gate device 100 is configured to be the logic gate device 100b with the third resistor 108 having the lower resistance value, the logic gate device 500 may generate an output according to logic AND.

Figure 6:
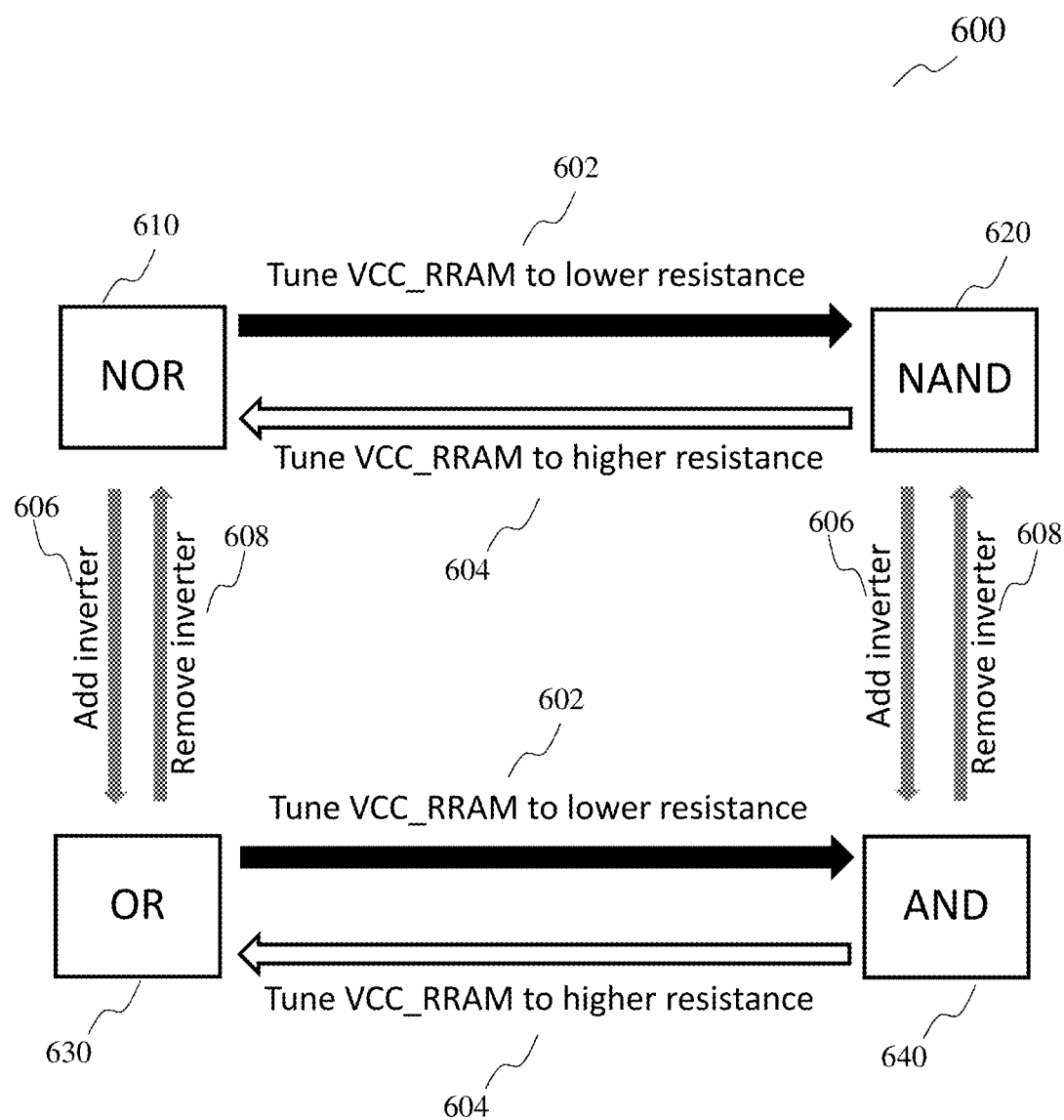
FIG. 6 shows a flow chart summarizing a method of reconfiguring logic gate devices according to various embodiments.

FIG. 6 shows a flow chart 600 summarizing a method of reconfiguring logic gate devices according to various embodiments. A NOR logic gate device 610, for example, the logic gate device 100a, may be reconfigured to be a NAND logic gate device 620 like the logic gate device 100b, by tuning the third resistor 108 to the lower resistance value, in 602. The third resistor 108 may also be referred herein as VCC_RRAM, as it may be an RRAM and the voltage supply terminal 126 may be connected to the voltage at the common collector. Conversely, the NAND logic gate device 620 may be reverted to the NOR logic gate device 610, by tuning the third resistor 108 to the higher resistance value, in 604. Similarly, an OR logic gate device 630, may be reconfigured to be an AND logic gate device 640, by tuning the third resistor 108 to the lower resistance value, in 602. Conversely, the AND logic gate device 640 may be reverted to the OR logic gate device 630, by tuning the third resistor 108 to the higher resistance value, in 604.

The NOR logic gate device 610 may be adapted to be the OR logic gate device 630, for example, like the logic gate device 500, by adding an inverter, in 606. Conversely, the OR logic gate device 630 may be adapted to be the NOR logic gate device 610, by removing the inverter, in 608. Alternatively, the OR logic gate device 630 by may be adapted to be the NOR logic gate device 610, by adding a further inverter. Similarly, the NAND logic gate device 620 may be adapted to be the AND logic gate device 640, by adding an inverter, in 606. Conversely, the AND logic gate device 640 may be adapted to be the NAND logic gate device 620, by removing the inverter, in 608. Alternatively, the AND logic gate device 640 by may be adapted to be the NAND logic gate device 620, by adding a further inverter.

According to various embodiments, the process of tuning the third resistor 108 from the higher resistance value to the lower resistance value (e.g. 602) and vice-versa (e.g. 604), may be performed using the circuit of the logic gate device 100, without the need for any external tuning circuits or devices. The tuning process may be part of an initialization process of the logic gate device 100 or 500, prior to operating the logic gate device. The initialization process may include connecting the first input terminal 120 and the second input terminal 122 to ground so that the transistor 102 is in the OFF state. The initialization process may include connecting the voltage supply terminal 126 to a first initialization voltage and connecting the first terminal 114 to a second initialization voltage. The values of the first initialization voltage and the second initialization voltage may be chosen so as to cause a sufficiently large current to pass through the third resistor in the desired direction, to change its resistance value.

Referring to FIG. 2, for the logic gate device 200, the initialization process may include simultaneously tuning the plurality of third transistors 108. Depending on the voltages connected to the respective voltage supply terminals 126 and the respective first terminals 114, the third resistor 108 connected to different transistors 102 may be tuned to different resistance values. For example, the voltage supply terminal 126a may be connected to a positive voltage while the first terminal 114a may be connected to a negative voltage; whereas the voltage supply terminal 126b may be connected to a negative voltage while the first terminal 114b may be connected to a positive voltage. As a result, the third resistor 108a may be tuned to a different resistance value from the third resistor 108b.

According to various embodiments, a logic gate device may be provided. The logic gate device may include the logic gate device 100, 200 or 500. The logic function of the logic gate device, in other words, the logical operation that the logic gate device is configured to perform, may be NOR, when the resistor connected to the first terminal of the transistor is tuned to have a higher resistance value. The resistor connected to the first terminal of the transistor may be the third resistor 108. The logic function of the logic gate device may be NAND when the resistor connected to the first terminal of the transistor is tuned to have a lower resistance value.

According to various embodiments, the logic gate device may include a further transistor having a first terminal, a second terminal and a gate terminal. The gate terminal of the further transistor may be connected to the first terminal of the transistor. The further transistor may function as an inverter for inverting the output generated at the first terminal of the transistor. The logic gate device may be configured to generate a further output voltage at the first terminal of the further transistor, according to a further logic function, based on input voltages received at the first input terminal and the second input terminal. The further logic function may be an inversion of the logic function. The further logic function may be AND when the resistor connected to the first terminal of the logic gate device is tuned to have a lower resistance value. The further logic function may be OR when the resistor connected to the first terminal of the logic gate device is tuned to have a higher resistance value.

According to various embodiments, a logic gate device may include the logic gate device 100, one or more further transistors, and one or more output resistors corresponding to the quantity of further transistors. Each further transistor may have a first terminal, a second terminal, and a gate terminal. The gate terminal of the transistor of the logic gate device 100 may be connected to the respective gate terminals of the one or more further transistors. Each output resistor may be connected to the first terminal of a respective further transistor. Each output resistor may be selectively tunable between a lower resistance value and a higher resistance value for changing a respective logic function. The logic gate device may be further configured to generate a respective further output voltage at the first terminal of each further transistor, according to the respective logic function, based on the input voltages received at the first input terminal and the second input terminal of the logic gate device.

According to various embodiments, a logic gate device may be provided. The logic gate device may include the logic gate device 100, 200 or 500. The logic gate device may include a first input terminal, a second input terminal and an output terminal. The output terminal may be configured to indicate the logic state of the logic gate device. The logic gate device may include a transistor, a first resistor, a second resistor and a third resistor. The transistor may have a first terminal, a second terminal, and a gate terminal. The first terminal of the transistor may be connected to the output terminal of the logic gate device. The first resistor may be connected between the first input terminal of the logic gate device and the gate terminal of the transistor. The second resistor may be connected between the second input terminal of the logic gate device and the gate terminal of the transistor. The third resistor may be connected between a voltage supply terminal and the first terminal of the transistor.

Figure 7:
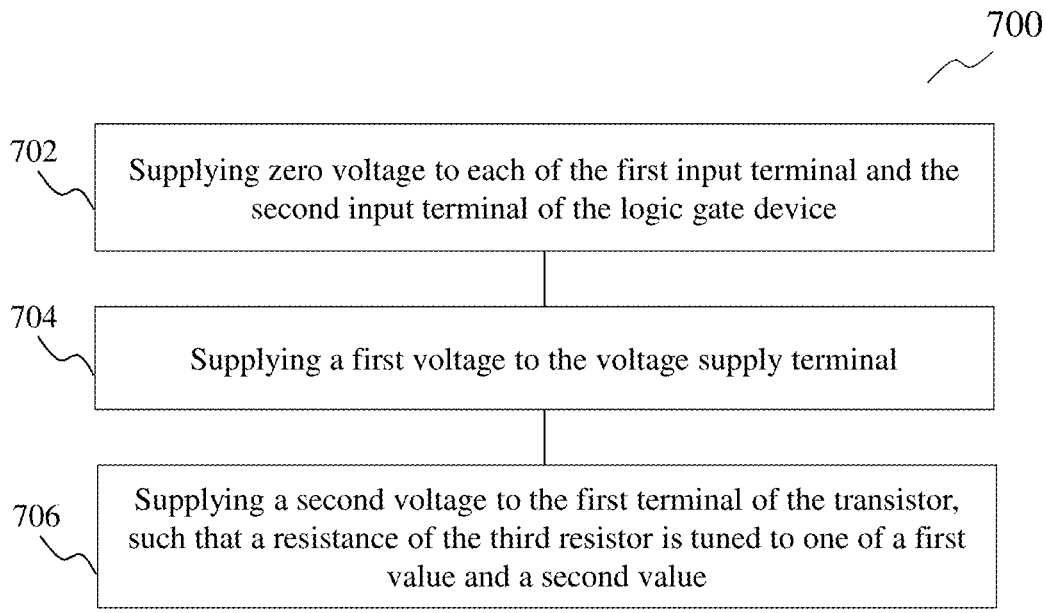
FIG. 7 shows a flow diagram of a method of initializing a logic gate device according to various embodiments.

FIG. 7 shows a flow diagram of a method of initializing a logic gate device according to various embodiments. The logic gate device may include the logic gate device 100. The method may include supplying zero voltage to each of the first input terminal 120 and the second input terminal 122 of the logic gate device 100, in 702. The method may include supplying a first voltage to the voltage supply terminal 126, in 704. The method may include supplying a second voltage to the first terminal 114 of the transistor 102, in 706. As a result, a resistance of the third resistor 108 may be tuned to one of the first value and the second value. The second voltage may be lower than the first voltage, to tune the third resistor 108 to the high resistance state. Alternatively, the second voltage may be higher than the first voltage, to tune the third resistor 108 to the first value.

Figure 8:
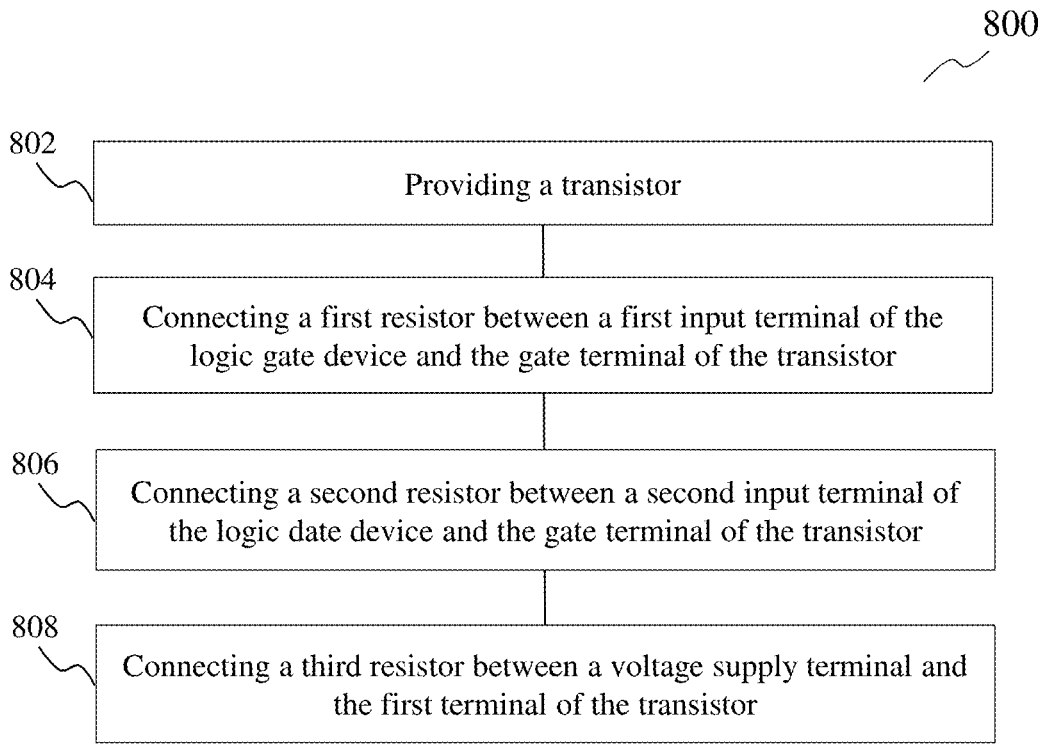
FIG. 8 shows a flow diagram of a method of forming a logic gate device according to various embodiments.

FIG. 8 shows a flow diagram of a method of forming a logic gate device according to various embodiments. The logic gate device may include the logic gate device 100. The method may include providing a transistor, in 802. The transistor may have a first terminal, a second terminal, and a gate terminal. The method may include connecting a first resistor between a first input terminal of the logic gate device and the gate terminal of the transistor, in 804. The method may include connecting a second resistor between a second input terminal of the logic gate device and the gate terminal of the transistor, in 806. The method may include connecting a third resistor between a voltage supply terminal and the first terminal of the transistor, in 808. The third resistor may be selectively tunable between a first resistance value and a second resistance value for changing a logic function of the logic gate device. The logic gate device may be configured to generate an output voltage at the first terminal of the transistor, according to the logic function, based on input voltages received at the first input terminal and the second input terminal of the logic gate device.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A logic gate device comprising:
a transistor having a first terminal, a second terminal, and a gate terminal;
a first resistor connected between a first input terminal of the logic gate device and the gate terminal of the transistor;
a second resistor connected between a second input terminal of the logic gate device and the gate terminal of the transistor; and
a third resistor connected between a voltage supply terminal and the first terminal of the transistor;
wherein the logic gate device is configured to generate an output voltage at the first terminal of the transistor based on input voltages received at the first input terminal and the second input terminal of the logic gate device,
wherein a resistance of the third resistor is selectively tunable between a first value and a second value for changing a logic function of the logic gate device,
wherein the logic function is NAND when the resistance of the third resistor is the first value, and
wherein the logic function is NOR when the resistance of the third resistor is the second value.

2. The logic gate device of claim 1, wherein the first value is in a range from 1 MΩ to 2 MΩ, and wherein the second value is in a range from 1 GΩ to 1.5 GΩ.

3. The logic gate device of claim 1, further comprising:
a further transistor having a first terminal, a second terminal, and a gate terminal;
wherein the gate terminal of the further transistor is connected to the first terminal of the transistor.

4. The logic gate device of claim 3, wherein the logic gate device is configured to generate a further output voltage at the first terminal of the further transistor based on input voltages received at the first input terminal and the second input terminal.

5. The logic gate device of claim 4, wherein the logic gate device is configured to generate the further output voltage at the first terminal of the further transistor according to a logic function, wherein a resistance of the third resistor is selectively tunable between a first value and a second value for changing the logic function, the logic function being AND when the resistance of the third resistor is the first value, and the logic function being OR when the resistance of the third resistor is the second value.

6. The logic gate device of claim 1, wherein one or more of the first resistor, the second resistor, and the third resistor is a memristor.

7. The logic gate device of claim 1, wherein one or more of the first resistor, the second resistor, and the third resistor is a resistive random-access memory.

8. The logic gate device of claim 1, wherein each of the first resistor and the second resistor has a resistance larger than 750 MΩ.

9. The logic gate device of claim 1, further comprising:
one or more further transistors, each of the further transistors having a first terminal, a second terminal, and a gate terminal,
wherein the gate terminal of the transistor is connected to the respective gate terminals of the one or more further transistors,
one or more output resistors, wherein each output resistor of the one or more output resistors is connected to the first terminal of a respective further transistor of the one or more further transistors, wherein a resistance of each output resistor is selectively tunable between a first value and a second value for changing a respective logic function;

wherein the logic gate device is further configured to generate a respective further output voltage at the first terminal of each further transistor, according to the respective logic function, based on the input voltages received at the first input terminal and the second input terminal of the logic gate device.

10. A logic gate device comprising:
a first input terminal, a second input terminal and an output terminal for indicating the logic state of the logic gate device;
a transistor having a first terminal, a second terminal, and a gate terminal;
a first resistor connected between the first input terminal of the logic gate device and the gate terminal of the transistor;
a second resistor connected between the second input terminal of the logic gate device and the gate terminal of the transistor; and
a third resistor connected between a voltage supply terminal and the first terminal of the transistor;
wherein the first terminal of the transistor is connected to the output terminal of the logic gate device,
wherein a resistance of the third resistor is selectively tunable between a first value and a second value for changing a logic function of the logic gate device,
wherein the logic function is NAND when the resistance of the third resistor is the first value, and
wherein the logic function is NOR when the resistance of the third resistor is the second value.

11. A method of forming a logic gate device, the method comprising:
providing a transistor having a first terminal, a second terminal, and a gate terminal;
connecting a first resistor between a first input terminal of the logic gate device and the gate terminal of the transistor;
connecting a second resistor between a second input terminal of the logic gate device and the gate terminal of the transistor; and
connecting a third resistor between a voltage supply terminal and the first terminal of the transistor;
wherein the logic gate device is configured to generate an output voltage at the first terminal of the transistor based on input voltages received at the first input terminal and the second input terminal of the logic gate device,
wherein a resistance of the third resistor is selectively tunable between a first value and a second value for changing a logic function of the logic gate device,
wherein the logic function is NAND when the resistance of the third resistor is the first value, and
wherein the logic function is NOR when the resistance of the third resistor is the second value.

12. The method of claim 11, further comprising:
providing a further transistor having a first terminal, a second terminal, and a gate terminal; and
connecting the gate terminal of the further transistor to the first terminal of the transistor.

13. The method of claim 12, wherein the logic gate device is configured to generate a further output voltage at the first terminal of the further transistor based on input voltages received at the first input terminal and the second input terminal, the further logic function being an inversion of the logic function.

14. The method of claim 13, wherein the logic gate device is configured to generate the further output voltage at the first terminal of the further transistor according to a further logic function, wherein a resistance of the third resistor is selectively tunable between a first value and a second value for changing a logic function of the logic gate device, wherein the further logic function is AND when the resistance of the third resistor is the first value, and wherein the further logic function is OR when the resistance of the third resistor is the second value.

15. The method of claim 11, wherein one or more of the first resistor, the second resistor, and the third resistor is a memristor.

16. The method of claim 11, wherein one or more of the first resistor, the second resistor, and the third resistor is a resistive random-access memory.

17. The method of claim 11, further comprising:
providing one or more further transistors, each of the further transistors having a first terminal, a second terminal, and a gate terminal;
connecting the gate terminal of the transistor to the respective gate terminals of the one or more further transistors,
connecting a respective output resistor to the first terminal of each further transistor, wherein a resistance of each output resistor is selectively tunable between a first value and a second value for changing a respective logic function;
wherein the logic gate device is further configured to generate a respective further output voltage at the first terminal of each further transistor, according to the respective logic functions, based on the input voltages received at the first input terminal and the second input terminal of the logic gate device.

* * * * *